United States Patent [19]

Hoshi

[11] Patent Number: 5,393,651
[45] Date of Patent: Feb. 28, 1995

[54] SILVER HALIDE LIGHT-SENSITIVE MATERIAL COMPRISING POLYMERIZABLE LAYER PROVIDED ON ALUMINUM SUPPORT

[75] Inventor: Satoshi Hoshi, Shizuoka, Japan

[73] Assignee: Fuji Photo Film Co., Ltd., Kanagawa, Japan

[21] Appl. No.: 271,916

[22] Filed: Jul. 8, 1994

[30] Foreign Application Priority Data

Jul. 12, 1993 [JP] Japan .................. 5-195109

[51] Int. Cl.6 .............................. G93C 1/77
[52] U.S. Cl. .................. 430/526; 430/523; 430/278
[58] Field of Search ............ 430/275, 278, 523, 526

[56] References Cited

U.S. PATENT DOCUMENTS 4,990,428  2/1991  Shimizu et al. .............. 430/278
5,196,288  3/1993  Nakamura .................... 430/526
5,273,858  12/1993  Coppens et al. .............. 430/526

*Primary Examiner*—Jack P. Brammer
*Attorney, Agent, or Firm*—Birch, Stewart, Kolasch & Birch

[57] ABSTRACT

A silver halide light-sensitive material is disclosed. The light-sensitive material comprises an aluminum support, an anodic oxide layer and a light-sensitive polymerizable layer in the order. The light-sensitive polymerizable layer contains silver halide, a reducing agent and an ethylenically unsaturated polymerizable compound or a cross-linkable polymer. According to the present invention, an intervening layer is further provided between the anodic oxide layer and the light-sensitive polymerizable layer. The intervening layer contains a compound having a metal cation or a metal oxide anion. The metal cation or the metal oxide anion has a standard electrode potential of 0 V or more.

14 Claims, 1 Drawing Sheet

5,393,651

SILVER HALIDE LIGHT-SENSITIVE MATERIAL COMPRISING POLYMERIZABLE LAYER PROVIDED ON ALUMINUM SUPPORT

FIELD OF THE INVENTION

The present invention relates to a silver halide light-sensitive material, which comprises a support and a light-sensitive polymerizable layer containing silver halide, a reducing agent and an ethylenically unsaturated polymerizable compound or a cross-linkable polymer. The invention particularly relates to the silver halide light-sensitive material having an aluminum support.

BACKGROUND OF THE INVENTION

U.S. Pat. No. 4,629,676 (Hayakawa et al) and European Patent Publication No. 0174634B1 disclose an image forming method comprising the steps of imagewise exposing to light a light-sensitive material, and heating the light-sensitive material. The light-sensitive material comprises a support and a light-sensitive layer containing silver halide, a reducing agent and a polymerizable compound. The light-sensitive material is heated to develop the silver halide and to harden the polymerizable compound.

The support of the light-sensitive material can be made of various substances, such as a paper, a synthetic paper, a plastic film and a metal plate. A paper laminated with a synthetic resin (e.g., polyethylene, polypropylene, polystyrene) is also available. The paper or the plastic film may be laminated with a metal. Further, a metal may be evaporated the paper or the plastic film.

The above-mentioned image forming method is available for forming a lithographic plate. U.S. Pat. No. 5,122,443 (Takeda) and European Patent Publication No. 0426192B1 disclose a method of forming the lithographic plate.

The support of the lithographic plate is preferably made of an aluminum plate, a polyethylene terephthalate film, a paper or a synthetic paper. The aluminum plate is particularly preferred.

The aluminum support has been used in not only the above-mentioned method using silver halide but also conventional methods of forming lithographic plate using a photopolymer. The aluminum support usually has an anodic oxide layer.

The surface of the aluminum support may be treated to form a rough surface (graining treatment) or a hydrophilic surface (Japanese Patent Publication No. 47(1972)-5125 and U.S. Pat. Nos. 3,834,498 and 4,087,341). An intervening (undercoating) layer of a hydrophilic compound may be provided on the aluminum support to decrease stains in printed matters (U.S. Pat. Nos. 2,098,627 and 3,860,426 and Japanese Patent Provisional Publications No. 60(1985)-149491 and 4(1992)-282637). The stains are caused by contamination of a light-sensitive layer within non-image area. The amounts of impurities in the aluminum support are preferably reduced to prevent the printed matters from ink stains, as is described in Japanese Patent Provisional Publications No. 58(1983)-11759, No. 58(1983)-221254, No. 62(1987)-146694 and No. 62(1987)-148295. Examples of the impurities include silicon, copper and iron. The impurities attach ink to non-image area, which causes the ink stains.

SUMMARY OF THE INVENTION

The present inventor has studied a light-sensitive material having an aluminum support. The inventor has formed an image by imagewise exposing to light the above-mentioned silver halide light-sensitive material, heating the light-sensitive material to form a hardened image, and washing the material with an alkaline solution to remove the unhardened area. As a result, many small polymer spots are observed within the unhardened (non-image) area. Further, ink stains are observed in addition to the spots within the non-image area of printed matters.

The above-mentioned problems are caused only in the case that an aluminum support is used. A polymer film support does not cause such a problem. Further, the problems are caused only in the case that a silver halide light-sensitive material is used. Accordingly, the problems are peculiar to the silver halide light-sensitive material having an aluminum support.

The inventor assumes two causes of the problems. First, impurities (e.g., iron, copper) contained in the aluminum support may directly react with silver halide at a development process. The catalytic reaction may induce a fog development of silver halide. Second, impure metals and the aluminum may form a local electric cell. The cell may induce a hardening reaction of a polymerizable compound or a cross-linkable polymer. The second assumption is rather strong with respect to the cause of ink stains. The formed local cell causes a corrosion reaction with a halide ion formed from silver halide. A product of the corrosion reaction develops the silver halide to form a radical, which causes a hardening reaction.

A presensitized lithographic plate having the above-mentioned problems cannot form a clear printed image. In more detail, spots and ink stains are observed within the non-image area of printed matters.

An object of the present invention is to remove the polymer spots caused within the non-image area.

Another object of the invention is to provide a silver halide light-sensitive material that forms a clear printed image without the spots and the ink stains within the non-image area.

According to study of the inventor, the above-mentioned problems can be solved by providing an intervening layer that contains a specific compound. The compound has a metal cation or a metal oxide anion, which has a specific electrochemical character. The specific compound prevents silver halide within a non-image area from fog development. In more detail, the specific ion has a function of trapping impure metals and products of corrosion reactions, which cause stains in the printed image.

The present invention provides a silver halide light-sensitive material which comprises an aluminum support, an anodic oxide layer and a light-sensitive polymerizable layer in that order, said light-sensitive polymerizable layer containing silver halide, a reducing agent and an ethylenically unsaturated polymerizable compound or a cross-linkable polymer, wherein an intervening layer is further provided between the anodic oxide layer and the light-sensitive polymerizable layer, said intervening layer containing a compound having a metal cation or a metal oxide anion, and said metal cation or said metal oxide anion having a standard electrode potential of 0 V or more.

Impure metals and products of corrosion reactions are trapped by the above-mentioned specific ion contained in the silver halide light-sensitive material of the present invention. Accordingly, the fog development of silver halide within non-image area can be prevented by the specific compound.

Therefore, the silver halide light-sensitive material of the present invention can form a clear printing plate having no polymer spots within the non-image area. Further, the formed printing plate can form a clear printed image having neither spots nor ink stains.

DETAILED DESCRIPTION OF THE INVENTION

Figure 1:
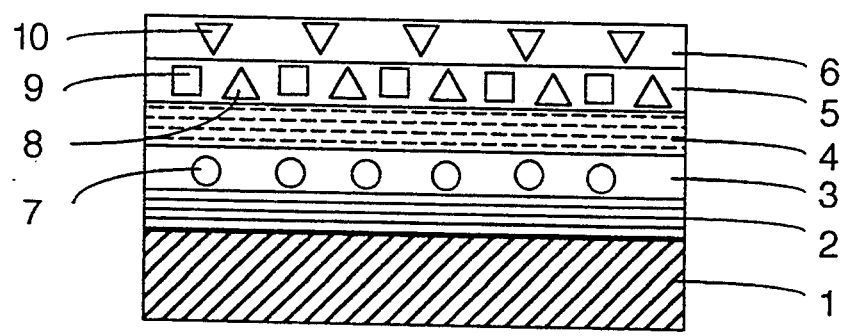
FIG. 1 is a sectional view schematically illustrating a preferred embodiment of a silver halide light-sensitive material of the present invention.

The silver halide light-sensitive material has an aluminum support. The aluminum support has an anodic oxide layer. Further, a specific intervening layer of the present invention is provided on the anodic oxide layer. A light-sensitive polymerizable layer is provided on the intervening layer.

The aluminum support is made of an aluminum plate, which comprise pure aluminum or aluminum alloy. The aluminum alloy contains a small amount of hetero atoms in addition to aluminum. Examples of the hetero atoms include silicon, iron, manganese, copper, bismuth, nickel and titanium. The amount of the hetero atoms contained in the alloy is not more than 10 wt. %. Pure aluminum is preferred to the alloy. However, it is technically and economically difficult to produce perfectly pure aluminum. Accordingly, the amounts of the hetero atoms are reduced as small as possible technically and economically. The present invention now solves the problems caused by the impure atoms. Accordingly, the aluminum alloy containing the hetero atoms of not more than 10 wt. % is available in the invention. The commercially available aluminum products usually have a metal purity of not less than 90 wt. %. Therefore, various commercial aluminum products are available in the present invention.

The aluminum support preferably has a thickness in the range of 0.1 to 0.5 mm.

Before forming an anodic oxide layer, the aluminum support is preferably treated to form a rough surface.

Before the surface treatment, a degreasing treatment may be conducted to remove rolling oil from the surface. The degreasing treatment can be conducted using a surface active agent or an aqueous alkaline solution.

The aluminum plate is preferably treated with respect to at least one surface according to the present invention. Of course, both surfaces of the plate can be subjected to a surface treatment. The treatments for one surface of the plate are described below. The both surfaces can also be treated in a similar manner.

The aluminum plate can be treated to form a rough surface by various treatments, such as a mechanical treatment, an electrochemical treatment and a chemical treatment. According to the mechanical treatment, the surface of the plate is ground by abrasive balls, a brush, a blast or buffs. According to the electrochemical and the chemical treatment, the surface of the plate is partially dissolved. The electrochemical treatment is conducted in an electrolytic solution of hydrochloric acid or nitric acid using an alternating or direct current. A combination of the mechanical treatment and electrochemical treatment is available, as is described in Japanese Patent Provisional Publication No. 54(1979)-63902.

An alkaline etching treatment or a neutralizing treatment can be conducted after the surface treatment, if necessary.

The anodic oxide layer is formed by an anodizing treatment.

An electrolyte is used to form a porous oxide layer. There is no specific limitation with respect to the electrolyte. Examples of the electrolytes include sulfuric acid, phosphoric acid, oxalic acid, chromic acid and mixtures thereof. The concentration of the electrolyte is determined according to the nature of the electrolyte.

The conditions of the anodizing treatment are also determined according to the nature of the electrolyte. The concentration of the electrolyte is generally in the range of 1 to 80 wt. %. The temperature of the electrolytic solution is generally in the range of 5° to 70° C. The electric current density is generally in the range of 5 to 60 A/dm$^2$. The voltage is generally in the range of 1 to 100 V. The time for the anodizing treatment is generally in the range of 10 seconds to 50 minutes. The amount of the anodic oxide layer is preferably not less than 1.0 g/m$^2$, and more preferably in the range of 2.0 to 6.0 g/m$^2$. If the amount is less than 1.0 g/m$^2$, the mechanical strength of the printing plate is decreased. In more detail, the plate wear is degraded, and the non-image area of the lithographic plate tends to be scratched. In such a case, an ink is attached to the scratch of the plate to cause scratch stains.

On the above-mentioned anodic oxide layer, the intervening layer of the present invention is formed. The intervening layer contains a compound having a metal cation or a metal oxide anion. The metal cation or the metal oxide anion has a standard electrode potential of 0 V or more.

The standard electrode potential means an equilibrium electrode potential where all the electrode reaction components of a simple electrode are present at standard conditions. By convention, the origin of the value is considered as the value of the standard hydrogen electrode (0 V). According to the present invention, the standard electrode potential is measured at 25° C. as usual.

The metal cation or the metal oxide anion having a standard electrode potential of 0 V or more means an oxidizing ion showing a standard electrode potential of 0 V or more against a reducing ion, metal or compound. In the case that the oxidizing ion has two or more reducing components (namely two or more electrode potential), it satisfies the present invention that at least one standard electrode potential is 0 V or more.

Many documents describe the standard electrode potentials of various redox systems. For example, the standard electrode potentials are described in D. J. G. Ives & G. J. Jang, "Reference Electrodes Theory and Practice," Academic Press, New York and London (1961). Accordingly, the standard electrode potentials can easily be obtained by referring to the documents in place of measuring the values.

The metal cation or the metal oxide anion has a standard electrode potential of 0 V or more. The ion preferably has a standard electrode potential in the range of 0.3 to 1.0 V. Examples of the metal cations or the metal oxide anions include $Cu^{2+}$, $Cu^+$, $Pd^{2+}$, $Ag^+$, $Pt^{2+}$, $Pt^{4+}$, $Au^{3+}$, $Hg^+$, $Hg^{2+}$, $MnO_4^-$, $Cr_2O_7^{2-}$, $Co^{3+}$, $Rh^{3+}$, $FeO_4^{2-}$ and $ReO_4^-$.

The compounds having the above-mentioned ions can be in the form of a metal salt, a metallic acid, a metal oxide and an organometallic compound. Examples of the compounds include copper(II) nitrate, palladium(II) nitrate, silver nitrate, mercury(II) nitrate, copper(II) sulfate, palladium(II) sulfate, silver sulfate, mercury(I) sulfate, mercury(II) sulfate, copper(I) chloride, copper(II) chloride, palladium(II) chloride, silver chloride, silver bromide, silver iodide, potassium tetrachloroplatinate(II), potassium chloroplatinate(IV), chloroplatinic(IV) acid, chloroauric(III) acid, sodium chloroaurate(III), potassium cyanoaurate(III), silver nitrate, palladium acetate, silver carbonate, silver chlorate, silver chromate, silver 4-cyclohexylbutyric acid, silver 2,3-dibromopropionate, silver iodate, silver lactate, silver nitrite, silver perchlorate, silver tetrafluoroborate, silver thiocyanate, silver p-toluenesulfonate, silver vanadate, iron(VI) oxide hydrate, perrhenic acid, rhodium(III) chloride and cobalt(III) hydroxide.

The intervening layer is formed by dissolving the above-mentioned compound in water or an organic solvent, and coating the solution on the anodic oxide layer. The concentration of the compound in the coating solution is preferably in the range of 0.0001 to 20 wt. %, and more preferably in the range of 0.001 to 10 wt. %. The coating solution preferably has a pH value in the range of 1 to 13, and more preferably in the range of 2 to 12.5.

The intervening layer preferably contains a binder for film formation of the layer. A hydrophilic polymer is preferably used as the binder. Natural and synthetic hydrophilic polymers are available. Examples of the natural hydrophilic polymers include water-soluble polysaccharides (e.g., starch, cellulose, alginic acid, gum arabic, pullulan, dextran) and proteins (e.g., casein, gelatin). Examples of the synthetic hydrophilic polymers include polyvinyl alcohol, polyvinyl ether, polyvinyl pyrrolidone and polyethylene oxide.

The amount of the binder in the coating solution is preferably in the range of 0.1 to 30 wt. %, and more preferably in the range of 0.5 to 20 wt. %.

In the case that an organic solvent is used in the coating solution, a hydrophobic polymer can be used as a binder.

The intervening layer can be coated according to a dip coating method, a rotor coating method, a spray coating method or a curtain coating method. The intervening layer preferably has a dry coating amount in the range of 0.1 to 100 mg/m², and more preferably in the range of 1 to 50 mg/m². In the case that the coating amount is less than 0.1 mg/m², it is difficult to remove polymer spots from the non-image area. In the case that the coating amount is more than 100 mg/m², it is difficult to adhere a light-sensitive polymerizable layer to the aluminum support. If the light-sensitive polymerizable layer is not sufficiently adhered to the support, the plate wear would be degraded, and the development of silver halide would be accelerated to cause a fog in the image.

The aluminum support can be treated to be hydrophilic. The hydrophilic treatment can be conducted before or after forming the intervening layer. The hydrophilic treatment uses alkaline metal silicate (e.g., aqueous sodium silicate solution), potassium fluoro-zirconate or polyvinyl phosphonic acid. The alkaline metal silicate treatment is particularly preferred. The alkaline metal silicate treatment is disclosed in U.S. Pat. Nos. 2,741,066, 3,181,461, 3,280,734 and 3,902,373. The potassium fluoro-zirconate treatment is disclosed in Japanese Patent Publication No. 36(1961)-22063. The polyvinyl phosphonic acid treatment is disclosed in U.S. Pat. No. 3,276,868.

A light-sensitive polymerizable layer is provided on the above-mentioned intervening layer. The light-sensitive polymerizable layer preferably comprises a light-sensitive layer containing silver halide and a polymerizable layer containing the ethylenically unsaturated polymerizable compound or the cross-linkable polymer. The reducing agent can be contained in the light-sensitive layer or the polymerizable layer. Further, the other optional layers can be provided in the silver halide light-sensitive material. The optional layers include an overcoating layer, an image formation accelerating layer, an adhesive layer, a strippable layer and an intermediate layer. An image formation accelerating layer containing a base precursor is preferably provided in the silver halide light-sensitive material.

FIG. 1 is a sectional view schematically illustrating a preferred embodiment of a silver halide light-sensitive material of the present invention.

As is shown in FIG. 1, the silver halide light-sensitive material of the present invention preferably comprises an aluminum support (1), an anodic oxide layer (2), a specific under coating layer (3), a polymerizable layer (4), a light-sensitive layer (5) and an image formation accelerating layer (6) in the order. The intervening layer (3) contains a compound having a metal cation or a metal oxide anion (7). In the polymerizable layer (4), an ethylenically unsaturated polymerizable compound or a cross-linkable polymer is preferably dispersed without use of microcapsules. The light-sensitive layer (5) contains silver halide (9) and a reducing agent (8). The image formation accelerating layer (6) contains a base precursor (10).

The layers and the components provided on the intervening layer are described below. The steps for image formation are also described below.

[Light-sensitive layer]

The light-sensitive layer contains silver halide, which forms a radical after an exposing step and a developing step. The formed radical is transferred to a polymerizable layer to cause a hardening reaction.

The light-sensitive layer preferably has a thickness in the range of 0.1 to 20 μm, and more preferably in the range of 0.5 to 10 μm.

[Polymerizable layer]

The polymerizable layer contains an ethylenically unsaturated polymerizable compound or a cross-linkable polymer. The polymerizable layer is hardened by a polymerization reaction or a cross-linking reaction.

The polymerizable layer preferably has a thickness in the range of 0.1 to 20 μm, and more preferably in the range of 0.3 to 7 μm.

[Overcoating layer and image formation accelerating layer]

An overcoating layer has a function of preventing oxygen in the air from permeating into the polymerizable layer. Oxygen functions as a polymerization inhibitor. Accordingly, the hardness of the polymerizable layer can be improved by providing the overcoating layer. The overcoating layer can also function as a protective layer. The image formation accelerating layer contains a component (e.g., a base or base precursor, a reducing agent, a heat development accelerator)

which accelerates an image forming reaction. The image formation accelerating layer has another function of the above-mentioned overcoating layer.

These layers may contain a matting agent, which has a function of reducing adhesion on the surface of the silver halide light-sensitive material to prevent adhesion when the materials are stacked.

The overcoating layer or the image formation accelerating layer preferably has a thickness in the range of 0.3 to 20 µm, and more preferably in the range of 0.5 to 10 µm.

The overcoating layer or the image formation accelerating layer is usually made of a hydrophilic polymer. A hydrophobic polymer is also available. The hydrophobic layer can be formed by dissolving a hydrophobic polymer in a solvent and coating the solution. Further, the layers can be formed by coating a polymer latex. The layer containing a hydrophobic polymer should be removed after a heat development and before an etching treatment.

[Adhesive layer]

An adhesive layer can be provided in the silver halide light-sensitive material to form a toner image. The adhesive layer contains a polymer, to which toner particles adhere.

The adhesive polymer preferably is a natural or synthetic rubber. Examples of the synthetic rubbers include polyisobutylene, nitryl rubber, butyl rubber, chlorinated rubber, polyvinyl isobutyl rubber, silicon elastomer, neoprene and a copolymer rubber (e.g., styrene-butadiene copolymer, styrene-isobutylene copolymer). The copolymer may be any of a random copolymer, a block copolymer and a graft copolymer.

The adhesive layer preferably has a thickness in the range of 0.01 to 10 µm, and more preferable in the range of 0.05 to 5 µm.

[Strippable layer]

A strippable layer can be provided in the silver halide light-sensitive material to form a transferred image.

The strippable layer is not adhesive at room temperature so that it is easily removed from the support. The layer is usually adhesive at an elevated temperature. The strippable layer usually contains an organic polymer (e.g., polyvinyl acetal resin, polyamide resin) as matrix. The matrix polymer preferably has a flow softening point that is higher than a heating temperature required for developing silver halide.

The strippable layer preferably contains a fluorine compound in an amount of not less than 1 wt. %. A fluorine surface active agent is preferably used as the fluorine compound.

The strippable layer preferably has a thickness of not less than 1.0 µm, and more preferably of not less than 1.4 µm.

[Intermediate layer]

An intermediate layer can be provided in the silver halide light-sensitive material.

The intermediate layer can function as an antihalation layer or a barrier layer. The barrier layer prevents components from moving between layers when the light-sensitive material is stored. The composition of the intermediate layer is determined according to its function. The intermediate layer can be made of a hydrophilic polymer used in the light-sensitive layer or the overcoating layer.

The intermediate layer preferably has a thickness of not more than 10 µm.

[Silver halide]

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. In addition to these regular crystals, irregular forms and mixed forms are available. Examples of the irregular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 µm. The grains may also be relatively large grains having a diameter of more 10 µm. The silver halide emulsion may be a polydispersed emulsion or a monodispersed emulsion. The monodispersed emulsion is described in U.S. Pat. Nos. 3,574,628 and 3,655,394 and British Patent No. 1,413,748.

With respect to the crystal structure of the silver halide grains, the individual grains may have a homogeneous halogen composition or a heterogeneous halogen composition. In the heterogeneous composition, the composition varies from the outer surface portion to the inside portion. The grains may have a multi-layered structure. Further, the silver halide grains may be bonded with other silver halide grains having different halogen composition through epitaxial bonding. The grains may be bonded with compounds other than the silver halide such as silver rhodanate and lead oxide.

Various substances in the form of salt can be added to the silver halide according to a conventional process at the grain formation or after the grain formation. Examples of the substances include copper, thallium, lead, cadmium, zinc, a chalcogen such as sulfur, selenium and tellurium, gold, and a group III noble metal such as rhodium, iridium, iron, platinum and palladium. The conventional process is described in U.S. Pat. Nos. 1,195,432, 1,191,933, 2,448,060, 2,628,167, 2,950,972, 3,488,709, 3,737,313, 3,772,031, 4,269,927 and Research Disclosure (RD), No. 13,452 (June 1975).

The silver halide grains can be doped with iridium ion by adding an aqueous solution of an iridium compound to a silver halide emulsion. Examples of water-soluble iridium compounds include hexachloroiridic-(III) salts and hexachloroiridic(IV) salts. The silver halide grains can also be doped with rhodium ion by adding an aqueous solution of a rhodium compound to a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide. In the case that iridium compound and the rhodium compound are used in combination, the rhodium compound is preferably added to the emulsion before the addition of the iridium compound.

Two or more kinds of silver halide grains that differ in halogen composition, crystal habit, grain size, or other features from each other can be used in combination.

The silver halide is preferably used in the form of an emulsion. The silver halide emulsion can be prepared by known processes, which are described in Research Disclosure (RD), No. 17,643, pages 22 to 23 (December 1978), (Emulsion preparation and types); and Research Disclosure, No. 18,716, p. 648, (November 1979).

The silver halide emulsion is generally used after a physical ripening and a chemical sensitization.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

Silver halide grains preferably have a relatively low fogging value.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

A supersensitizer can be added to the emulsion in addition to the sensitizing dye. The supersensitizer itself has neither a spectral sensitization effect nor an absorption of visible light, but shows a supersensitizing effect on the sensitizing dye.

[Organic metallic salt]

An organic metallic salt can be added to the light-sensitive layer containing silver halide. An organic silver salt is particularly preferred.

Examples of organic moieties of the salts include triazoles, tetrazoles, imidazoles, indazoles, thiazoles, thiadiazoles, azaindenes. An aliphatic, aromatic or heterocyclic compound having a mercapto group is also available as the organic moiety. Further, silver carboxylates and acetylene silver are available as the organic silver salt. Two or more organic metallic salts can be used in combination.

The organic silver salt is generally used in an amount of $10^{-5}$ to 10 mol, and preferably $10^{-4}$ to 1 mol based on 1 mol of silver halide. A similar effect can be obtained by adding the organic moiety of the organic metallic salt in place of the salt itself to the light-sensitive layer containing silver halide. The organic moiety can partially react with the silver halide to form the organic metallic salt.

[Reducing agent]

The reducing agent has a function of reducing the silver halide or a function of accelerating (or inhibiting) a hardening reaction of the polymerizable compound or the cross-linkable polymer. There are known various reducing agents having the functions. Examples of the reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind or amount of the above reducing agent, the polymerizable compound or the cross-linkable polymer can be hardened within the area where a latent image of the silver halide has been formed. In the alternative, the hardening reaction can proceed within the area where a latent image of the silver halide has not been formed. The following system (A), (B) or (C) can be employed.

(A) The reducing agent itself can be oxidized to form an oxidation product when the reducing agent develops silver halide. The oxidation product is decomposed in the layer to form a radical. Thus a polymerization reaction proceeds within the area where the latent image of silver halide has been formed. In the system (A), hydrazines are preferably used as the reducing agent. The hydrazines are used singly or in combination with other reducing agents.

(B) The oxidation product may have a function of inhibiting the polymerization. In this case, the polymerization is inhibited within the area where the latent image of silver halide has been formed. The polymerization is caused by a polymerization initiator within the area where the latent image of silver halide has not been formed. In the system (B), 1-phenyl-3-pyrazolidones are preferably used as the reducing agent.

(C) The reducing agent itself may have a function of inhibiting the polymerization and the oxidation product has no or weak inhibiting function. In this case, the polymerization is inhibited within the area where the latent image of silver halide has not been formed. The polymerization is caused by a polymerization initiator within the area where the latent image of silver halide has been formed. In the system (C), hydroquinones are preferably used as the reducing agent.

In the systems (B) and (C), a polymerization initiator (a thermal polymerization initiator or a photopolymerization initiator) is contained in a layer of the light-sensitive material. U.S. Pat. No. 4,649,098 and European Patent Publication No. 0202490 describe the systems (B) and (C).

The reducing agents (including compounds referred to as developing agent or hydrazine derivative) are described in Japanese Patent Provisional Publications No. 61(1986)-183640, No. 61(1986)-183535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, and Japanese Patent Applications No. 63(1988)-97379, No. 63(1988)-296774, No. 63(1988)-296775, No. 1(1989)-27175, No. 1(1989)-54101 and No. 1(1989)-91162. The reducing agents are also described in T. James, The Theory of the Photographic Process, 4th edition, pages 291 to 334 (1977), Research Disclosure, Vol. 170, No. 17029, pages 9 to 15 (June 1978), and Research Disclosure, Vol. 176, No. 17643, pages 22 to 31 (December 1978). Further, a reducing agent precursor is also available. The precursor can release a reducing agent under heating or in contact with a base.

When the reducing agent is basic, that is, it forms a salt with an acid, the reducing agent can be used in the form of a salt with an acid. The reducing agents can be used singly or in combination. Certain interactions between those reducing agents may be expected where two or more reducing agents are used in combination. One of the interactions is for an acceleration of reduction of silver halide (or an organic silver salt) through so-called super-additivity. The other interaction is for a chain reaction between an oxidant of one reducing agent formed by a reduction of silver halide (or an organic silver salt) oxidation-reduction reaction and another reducing agent. The chain reaction induces or inhibits the polymerization of the polymerizable compound. Both interactions may occur simultaneously. Thus, it is difficult to determine which of the interactions has occurred in practical use.

The reducing agent is used in an amount of 0.1 to 10 mol, and more preferably 0.25 to 2.5 mol based on 1 mol of silver halide.

[Polymerization initiator]

In the systems (B) and (C) described above, a thermal polymerization initiator or a photopolymerization initiator is contained in the light-sensitive material. Various known initiators are available. When the photopolymerization initiator is used, the light-sensitive material is uniformly exposed to light after the developing step.

A thermal polymerization initiator is described in Addition Polymerization and Ring Opening Polymerization, pages 6 to 18, edited by the Editorial Committee of High Polymer Experimental Study of the High Polymer Institute, published by Kyoritsu Shuppan (1983). Examples of the thermal polymerization initiators include: azo compounds such as azobisisobutyronitrile, 1,1-azobis(1-cyclohexanecarbonitrile), dimethyl-2,2'-azobisisobutyrate, 2,2-azobis(2-methylbutyronitrile) and azobisdimethylbaleronitrile; organic peroxides such as benzoyl peroxide, di-t-butyl peroxide, dicumyl peroxide, t-butyl hydroperoxide and cumene hydroperoxide; inorganic peroxides such as hydrogen peroxide, potassium persulfate and ammonium persulfate; and sodium p-toluenesulfinic acid.

The photopolymerization initiator is described in Oster et al., Chemical Review, vol. 68, pages 125 to 151 (1968) and Kosar, Light-Sensitive System, pages 158 to 193, John Wiley & Sons (1965). Examples of the photopolymerization initiator include carbonyl compounds (e.g., α-alkoxyphenyl ketones, polycyclic quinones, benzophenone derivatives, xanthones, thioxanthones and benzoines), halo-gen-containing compounds (e.g., chlorosulfonyl or chloromethyl polynuclear aromatic compounds, chlorosulfonyl or chloromethyl heterocyclic compounds, chlorosulfonyl or chloromethyl benzophenones and fluorenones), haloalkanes, α-halo-α-phenylacetophenones, redox couples of photo-reducible dye and reducing agent, organic sulfur compounds, peroxides, photo semi-conductors (e.g., titanium dioxide and zinc oxide), metallic compounds (e.g., ferrous salt, metallic salt of carbonyl compound, metal complex and uranyl salt), silver halide, azo compounds and diazo compounds.

Concrete examples of the photopolymerization initiators include 2-dimethoxy-2-phenylacetophenone, 2-methyl-[4-(methylthio)phenyl]-2-morpholino-1-propanone, benzoin butyl ether, benzoinisopropyl ether, benzophenone, Michler's ketone, 4,4-diethylaminobenzophenone, chloromethylbenzophenone, chlorosulfonylbenzophenone, 9,10-anthraquinone, 2-methyl-9,10-anthraquinone, chlorosulfonyl anthraquinone, chloromethyl anthraquinone, 9,10-phenanthrenequinone, xanthone, chloroxanthone, thioxanthone, chlorothioxanthone, 2,4-diethylthioxanthone, chlorosulfonylthioxanthone, chloromethylbenzothiazole, chlorosulfonylbenzoxazole, chloromethylquinoline, fluorene and carbon tetrabromide.

The polymerization initiator is used in an amount of preferably 0.001 to 0.5 g, and more preferably 0.01 to 0.2 g based on 1 g of the polymerizable compound.

[Polymerizable compound]

The polymerizable compound used in the present invention has an ethylenically unsaturated group.

Examples of the ethylenically unsaturated polymerizable compounds include acrylic acids, salts of acrylic acids, acrylic esters, acrylamides, methacrylic acids, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof. Acrylic esters and methacrylic esters are preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxy acrylate, nonylphenyloxyethyl acrylate, 1,3-dioxolane acrylate, hexanediol diacrylate, butanediol diacrylate, neopentyl glycol diacrylate, trimethylolpropane triacrylate, tricyclodecanedimethylol diacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxanediacrylate, 2-(2-hydroxy-1,1-dimethylethyl)-5,5-dihydroxymethyl-1,3-dioxanetriacrylate, triacrylate of propylene oxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentyl glycol dimethacrylate, trimethylolpropane trimethacrylate, pentaerythritol trimethacrylate, pentaerythritol tetramethacrylate and dimethacrylate of polyoxyalkylenated bisphenol A.

[Cross-linkable polymer]

The cross-linkable polymer used in the present invention has a functional group that is reactive to a radical. The polymer may be a homopolymer or a copolymer with a monomer that does not have a reactive group.

The cross-linkable polymers include:

(A) a polymer having a double bond in a main chain or a side chain of its molecule, to which a radical (a polymerization initiator radial or a growing radical at polymerization reaction of a polymerizable compound) can be added; and (B) a polymer that forms a polymer radical by removing an atom (hydrogen, a halogen atom such as chlorine) from a main chain or a side chain.

The polymer (A) is described in Japanese Patent Provisional Publication No. 64(1990)-17047. Examples of the polymers include: a polymer having an ethylenically unsaturated double bond in its side chain (e.g., a homopolymer or a copolymer of allyl (meth)acrylate, 1,2-polybutadiene, 1,2-polyisoprene); a polymer having an unsaturated double bond in its main chain (e.g., poly-1,4-butadiene, poly-1,4-isoprene and copolymers thereof); and a natural or synthetic rubber.

The polymer (B) is described at pages 147 to 192 in Polymer Reaction (edited by Polymer Society in Japan, Kyoritsu Shuppan, 1978). Examples of the polymers include poly(meth)acrylate, polyvinyl butyral, polyvinyl formal, polyvinyl pyrrolidone, polyvinyl acetate, polyvinylidene chloride, chlorinated polyethylene, chlorinated polypropylene, polycarbonate, diacetyl cellulose, cellulose acetate butylate, triacetyl cellulose, ethyl cellulose, polyvinyl pyridine, polyvinyl imidazole and copolymers thereof. Examples of the copolymers include vinyl acetate-ethylene copolymer and vinylidene chloride-acrylonitrile copolymer.

In the case that an alkaline solution is used to remove the unhardened area, the cross-linkable polymer preferably contains an acidic functional group in its molecule. Examples of the acidic functional groups include carboxyl, an acid anhydride group, phenolic hydroxyl, sulfo, sulfonamido and sulfonimido. Examples of the acidic monomers include acrylic acid, methacrylic acid, styrenesulfonic acid and maleic anhydride. The amount of the monomer having the acidic functional group is preferably in the range of 1 to 50 mol %, and more preferably in the range of 5 to 30 mol %.

The polymerizable monomer and the cross-linkable polymer can be used singly or in combination of two or more monomers or polymers.

The polymerizable monomer and the cross-linkable polymer is preferably contained in the polymerizable layer in an amount of 3 to 90 wt. % based on the total amount of the polymerizable layer. The amount is more preferably in the range of 15 to 60 wt. %.

[Binder of polymerizable layer]

A binder may be added to the polymerizable layer of the multi-layered light-sensitive material to enhance the strength of the layer. Various natural or synthetic polymers are available as the binder. The above-mentioned cross-linkable polymer can also function as the binder.

The synthetic polymer can be formed by an addition reaction or a condensed reaction. The synthetic polymers of the addition reaction type include various vinyl polymers including homopolymers and copolymers. Examples of the condensed polymers include polyesters, polyamides, polyurethanes and polyester-polyamides.

In the case that an alkaline solution is used to remove the unhardened area, the binder polymer preferably contains an acidic functional group in its molecule. Examples of the acidic functional groups include carboxyl, an acid anhydride group, phenolic hydroxyl, sulfo, sulfonamido and sulfonimido. Examples of the acidic monomers include acrylic acid, methacrylic acid, styrenesulfonic acid and maleic anhydride. The amount of the monomer having the acidic functional group is preferably in the range of 1 to 50 mol %, and more preferably in the range of 5 to 30 mol %.

The binder polymer preferably is a cross-linkable acidic polymer. An example of the cross-linkable acidic polymer is a copolymer of allyl (meth)acrylate with (meth)acrylic acid.

An image can be obtained only using a cross-linkable polymer, such as a polymer having an ethylenically unsaturated side chain. However, an ethylenically unsaturated polymerizable compound is used to form a hard polymer image. Further, an image can also be obtained only using the ethylenically unsaturated polymerizable compound. However, the polymerizable compound is usually in the form of liquid. Accordingly, a binder polymer is preferably added to a polymerizable layer to obtain an appropriate hardness of the layer.

The amount of the binder is usually not more than 80 wt. %, and preferably not more than 70 wt. % based on the total amount of the polymerizable layer.

[Hydrophilic polymer]

A hydrophilic polymer is preferably added as a binder to a hydrophilic layer, such as a light-sensitive layer, an overcoating layer or an image formation accelerating layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer that swells in water has an affinity to water, but is not soluble in water because of the cross-linking structure of the polymer.

The natural or synthetic polymers can be used as the hydrophilic binder.

Examples of the natural hydrophilic polymer include polysaccharide such as starch derivatives, cellulose derivatives, alginic acid, pectic acid, gum arabic and pullulan, and protein such as casein and gelatin. The denatured polymers are also available. In preparation of the light-sensitive material (at the stage of coating or drying), these natural polymers may be denatured or crosslinked.

The synthetic hydrophilic polymer is a polymer or copolymer of water-soluble monomers. The examples of the hydrophilic polymer include polyvinyl alcohol, polyvinyl ether, polyvinyl pyrrolidone and derivatives thereof. Polyvinyl alcohol is particularly preferred.

Polyvinyl alcohol preferably has a high saponification degree of not less than 70%, more preferably of not less 10 than 80%, most preferably of not less than 95%. The polyvinyl alcohol having the high saponification degree has a very low transmission coefficient of oxygen.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl methacrylate and acrylamide.

Polyvinyl alcohol may also be denatured after the saponification. Hydroxyl in polyvinyl alcohol can be modified by etheration, esterification or acetylation.

A cross-linked polyvinyl alcohol is also available. Examples of the cross-linking agents include aldehyde, methylol compounds, diisocyanate, divinyl compounds, dicarboxylic acids and inorganic agents (e.g., borates, titanium and copper).

The molecular weight of the hydrophilic polymer is preferably in the range of 3,000 to 500,000. The hydrophilic polymer binder is preferably used in an amount in the range of 0.05 g to 20 g/m$^2$, and more preferably in the range of 0.1 to 10 g/m$^2$.

Gelatin can be used in combination with another hydrophilic polymer in a light-sensitive layer containing silver halide. In this case, the difference between the pH value of the layer and the isoelectric point of the gelatin is preferably larger than 1.2.

[Base and base precursor]

The light-sensitive material preferably contains a base or base precursor.

Various organic or inorganic bases and their precursors (e.g., decarboxylation type, thermal decomposition type, reaction type and complex salt-formation type) are available.

Inorganic bases are described in Japanese Patent Provisional Publication No. 62(1987)-209448. Examples of the organic bases include tertiary amine compounds (described in Japanese Patent Provisional Publication No. 62(1987)-170954), bisamidine compounds, trisamidine compounds or tetraamidine compounds (described in Japanese Patent Provisional Publication No. 63(1988)-316760) and bisguanidine compounds, trisguanidine compounds or tetraguanidine compounds (described in Japanese Patent Provisional Publication No. 64(1989)-68746). In the present invention, a base having a pKa value of not less 7 is preferred.

In the present invention, a base precursor is preferred to the base from the viewpoint of the storage stability of the light-sensitive material.

Preferred examples of the base precursors include salts of organic acids with bases that is decarboxylated under heating and urea compounds which release bases under heating. Examples of the reaction mechanisms of the base precursor include a reaction between the base precursor and a salt containing anion having higher compatibility with transition metal acetylide or transition metal ion than acetylide anion, and a reaction of introducing into water both of a basic metallic compound which is hardly dissolved in water and a compound capable of reacting with metal ion of the basic metallic compound in a water medium to form a complex salt so as to release a base through a reaction between those two compounds in the presence of water.

The base precursor preferably releases a base at a temperature in the range of 50° to 200° C., and more preferably in the range of 80° to 160° C.

The base or the base precursor can be used in an amount of preferably 0.1 to 20 mol, and more preferably 0.2 to 10 mol based on 1 mol of silver halide.

[Heat development accelerator]

The light-sensitive material can contain a heat development accelerator. The heat development accelerator may be contained in any layers of the light-sensitive material. The heat development accelerator has a function of increasing the plasticity of a polymer (contained in the polymerizable layer or the light-sensitive layer). The accelerator has another function of accelerating the dispersion of the components in the layers when it is dissolved by heat of the development process.

The heat development accelerator has been known as a plasticizer. The known plasticizers are described in Plastic Additives (written in Japanese), pages 21 to 63 (Taisei-sha); Plastics Additives, Second Edition; Hanser Publishers, Chapter 5, pages 251 to 296; Thermoplastic Additives, Marcel Dekker Inc., Chapter 9, pages 345 to 379; Plastic Additives, An Industrial Guide, Noyes Publications, Section 14, pages 333 to 485: The Technology of Solvents and Plasticizers, John Wiley & Sons, Inc., Chapter 15, pages 903 to 1027; Industrial Plasticizers, Pergamon Press; Plasticizer Technology, Vol. 1, Reinhold Publishing corp.; and Plasticization and Plasticizer Process, American Chemistry.

Examples of the heat development accelerator include glycols (e.g., diethylene glycol, dipropylene glycol), polyhydric alcohols (e.g., glycerol, butanediol, hexanediol), saccharides, formates, ureas (e.g., urea, diethylurea, ethyleneurea, propyleneurea), a urea resin, a phenol resin, amides (e.g., acetamide, propionamide) and sulfonamides. Two or more heat development accelerators can be used in combination. The heat development accelerators can be added to two or more layers of the light-sensitive material.

The amount of the heat development accelerator is preferably in the range of 0.05 to 2 $g/m^2$, and more preferably in the range of 0.1 to 1 $g/m^2$.

[Colorant]

The light-sensitive material may contain a colorant. The colorant can functions as an antihalation or antiirradiation dye. Further, a hardened image can be colored by the colorant. Various known dyes and pigments are available as the colorant provided that the colorant does not affect the sensitivity and the developing reaction of silver halide. The colorant can be contained in the polymerizable layer in the case that the colorant is used to function as an antihalation dye or to color a hardened image. The colorant can also be contained in the light-sensitive layer in the case that the colorant is used to function as an antiirradiation dye. The hue of the antihalation or antiirradiation dye is preferably adjusted within the sensitive light region of silver halide.

The pigments are commercially available. Further, pigments are described in various publications such as Handbook of Color Index, New Handbook of Pigments, (Nippon Ganryo Gijutsu Kyokai (edition), 1977), New Applied Technique of Pigments, (CMC Publishing, 1986), and Technique of Printing Ink, (CMC Publishing, 1984).

Examples of the pigments include black pigments, yellow pigments, orange pigments, brown pigments, red pigments, violet pigments, blue pigments, green pigments, fluorescent pigments, metal powder pigments and polymer pigments. Concrete examples of the pigments include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxadine pigments, isoindolinone pigments, quinophthalone pigments, dye-type lake pigments, azine pigments, nitroso pigments, nitro pigments, natural pigments, fluorescent pigments and inorganic pigments.

The pigment can be itself used or can be used after being subjected to surface treatment. The surface treatments include a method of coating a resin or wax on the surface, a method of depositing a surface active agent thereon and a method of bonding a reactive substance to the surface. Examples of the reactive substances include silane coupling agent, epoxy compound and polyisocyanate. Those methods are described, for example, in Nature and Application of Metal Soap, (Saiwai Shobo), Technique of Printing Ink, (CMC Publishing, 1984), and New Applied Technique of Pigments, (CMC Publishing, 1986).

The particle size of the pigment is preferably in the range of 0.01 to 10 $\mu m$, and more preferably in the range of 0.05 to 1 $\mu m$. For dispersing the pigment in a coating solution of the polymerizable layer, various conventional dispersing techniques for ink or toner are available. Examples of dispersing devices include a sand mill, an attritor, a pearl mill, a super mill, a ball mill, an impeller, a disperser, a KD mill, a colloid mill, a dyatron, a three-roll mill and a press kneader. The details are described in New Applied Technique of Pigments, (CMC Publishing, 1986).

The dyes are described in "Handbook of Dyes," Yuki Kagaku Kyokai (edition), 1970. Examples of the dyes include azo dyes, metal complex salt azo dyes, pyrazolone azo dyes, anthraquinone dyes, quinonimine dyes and methine dyes.

The antiirradiation dyes are described in Japanese Patent Publications No. 41(1966)-20389, No. 43(1968)-3504, No. 43(1968)-13168, Japanese Provisional Publications No. 2(1990)-39042, U.S. Pat. Nos. 2,865,752, 3,423,207, 3,697,037, and British Patents No. 1,030,392, No. 1,100,546.

The amount of the colorant is usually in the range of 0.01 to 2 g/m$^2$, and preferably in the range of 0.05 to 1 g/m$^2$.

[The other additives]

The light-sensitive material can contain the other additives such as an antifogging agent, a silver development accelerator and a stabilizer.

Examples of these compounds include azoles, azaindenes, nitrogen-containing carboxylic acids, phosphoric acids and acetylene compounds. The azoles and the azaindenes are described in Research Disclosure pages 24 to 25 (1978). The nitrogen-containing carboxylic acids and the phosphoric acids are described in Japanese Patent Provisional Publication No. 59(1984)-168442. The acetylene compounds are described in Japanese Patent Provisional Publication No. 62(1987)-87957. These compounds are generally used in an amount of $10^{-7}$ to 1 mol based on 1 mol of the silver halide.

[Development stopping agent]

The development stopping agent can be used in the light-sensitive material to obtain a clear image constantly regardless of the temperature and time for the development process. The development stopping agent can be a compound having a function of neutralizing a base or reacting with a base to reduce the base concentration in the layer to stop development. The agent can also be a compound having a function of mutually reacting with silver or a silver salt to suppress development, after the appropriate development. Examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. The development stopping agent is described in Japanese Patent Provisional Publications No. 62(1987)-253159, No. 2(1990)-42447 and No. 2(1990)-262661.

[Surface active agent]

A surface active agent may be contained in a layer of the light-sensitive material. Various nonionic, anionic, cationic or fluorine surface active agents are available. The surface active agent is described in Japanese Patent Provisional Publication No. 2(1990)-195356. Sorbitan, polyoxyethylene and a fluorine-containing compound are preferred.

[Matting agent]

A matting agent can be added to a back layer, an overcoating layer or an image formation accelerating layer. The matting agent is well known in the conventional silver halide photography. Inorganic or organic solid particles are available as the matting agent. The matting agent is usually dispersed in a hydrophilic colloidal binder.

Examples of the inorganic matting agents include oxides (e.g., silicon dioxide, titanium dioxide, magnesium oxide, aluminum oxide), alkali earth metal salts (e.g., barium sulfate, strontium sulfate, magnesium sulfate, potassium carbonate)., silver halide particles (which does not form an image) and glass.

Examples of the organic matting agents include starch, cellulose esters, cellulose ethers and synthetic resins. The synthetic resins are preferably not or slightly soluble in water. The synthetic resins can be made from alkyl acrylate, alkyl methacrylate, alkoxyalkyl acrylate, alkoxyalkyl methacrylate, glycidyl acrylate, glycidyl methacrylate, acrylamide, methacrylamide, vinyl ester, acrylonitrile, olefin, styrene and benzoguanamine. The synthetic resin polymer may be in the form of a copolymer. The copolymer can be made from the above-mentioned monomers and the other monomers, such as acrylic acid, methacrylic acid, $\alpha,\beta$-unsaturated dicarboxylic acid, hydroxyalkyl acrylate, sulfoalkyl acrylate, sulfoalkyl methacrylate and styrenesulfonic acid.

An epoxy resin, nylon, polycarbonate, a phenol resin, polyvinyl carbazole and polyvinylidene chloride are available as the matting agent.

The matting agent may be soluble in an alkaline solution. An example of the alkaline-soluble matting agent is alkyl methacrylate-methacrylic acid copolymer. The alkaline-soluble matting agent is described in Japanese Patent Provisional Publications No. 53(1978)-7231, No. 58(1983)-66937, No. 60(1985)-8894. The alkaline-soluble matting agent may have an anionic group, as is described in Japanese Patent Provisional Publication No. 58(1983)-166341.

The average particle size of the matting agent is preferably in the range of 1 to 50 μm. The particle size distribution may be monodispersed or polydispersed. The maximum particle size of the matting agent is preferably not more than 30 μm. The particles of not more than 20 μm is preferably 10 volume % of the total amount of the matting agent.

The amount of the matting agent is preferably in the range of 0.01 to 1 g/m$^2$, and more preferably in the range of 0.1 to 0.7 g/m$^2$.

[Polymerization inhibitor]

A polymerization inhibitor may be added to the polymerizable layer to prevent the dark reaction. Various known polymerization inhibitors are available. Examples of the polymerization inhibitors include a nitrosoamine, a thiourea, a thioamide, a urea compound, a phenol derivative, a nitrobenzene derivative and an amine. Concrete examples include aluminum salt of cupferron, N-nitrosodiphenylamine, allylthiourea, an aryl phosphate, p-toluidine, f-toluquinone, nitrobenzene, pyridine, phenothiazine, b-naphthol, naphthylamine, t-butylcatechol, phenothiazine, chloranil, p-methoxyphenol, pyrogallol, hydroquinone and an alkyl or aryl-substituted hydroquinone.

[Exposing step]

The wavelength of the light corresponds to the spectral sensitivity of silver halide. Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser), light emitting diode and cathode-ray tube. The wavelength is usually with in the visible, near ultraviolet and near infrared regions. A X-ray and an electron bean are also available. The amount of the exposure is determined by a sensitivity of the silver halide emulsion. The amount is usually in the range of 0.01 to 10,000 ergs/cm$^2$.

[Developing step]

The light-sensitive material is developed simultaneously with or after the exposing step. The light-sensitive material is preferably heated to develop the silver halide. However, a wet development using a developing solution is also available.

The heat development can be conducted by placing the light-sensitive material on a heated material (e.g., metal plate, block, roller). The light-sensitive material may be immersed in a heated liquid for the development. Further, the light-sensitive material may be irradiated with an infrared ray. The surface of the light-sensitive material may be open to the air while heating the material from the side of the support. The surface of the light-sensitive material may be covered with the heating means to prevent the air from penetrating into the layers. In the case that the surface is open to the air, a layer of the light-sensitive material preferably contains a polymer having a function of prevent the air from penetrating into the layers.

The heating temperature is preferably in the range of 60° to 200° C., and more preferably in the range of 100° to 150° C. The heating time is preferably in the range of 1 to 180 seconds, and more preferably in the range of 5 to 60 seconds.

A preheat treatment or post-heat treatment can be conducted before or after the heat development. The temperature of the preheat is lower than the heat development temperature, and the time is shorter than the development time. The post-heat treatment can be conducted after the image is formed, for example after removing the unhardened polymerizable layer.

In the system wherein the unexposed area is hardened, a thermal polymerization initiator or a photopolymerization initiator is preferably contained in the light-sensitive material. Where a thermal polymerization initiator is used, the initiator can function at the heat development to form an initiator radical uniformly. Where the photopolymerization initiator is used, the light-sensitive material is uniformly exposed to light after the developing step. The light source is determined based on the sensitive wavelength of the photopolymerization initiator. Examples of the light sources are described at the exposing step. The exposure amount is usually in the range of $10^3$ to $10^7$ ergs/cm$^2$.

After the heat development step, a hardened image can be formed on the light-sensitive layer. The hardened image is used in various technical fields. If necessary, some post treatment can be applied to the hardened image based on the chemical or physical differences between the hardened area and the unhardened area. The differences relate to solubility, surface adhesion, adhesion to the support, softening point, refraction, permittivity, diffusion character and coloring character. Examples of the post treatment include a removing step, a transferring step, a toning step and a dyeing step.

[Removing step]

The unhardened area can be selectively removed to form a polymer image based on a difference in the solubility between the hardened area and the unhardened area.

After the heat development, the light-sensitive material is immersed in a solvent (an etching solution) to conduct the removing step. The solvent is an organic solvent, an aqueous alkaline solution or a mixture thereof. The solvent should have a function of dissolving or swelling the unhardened area. Examples of the alkaline compound include sodium hydroxide, potassium hydroxide, sodium carbonate, sodium silicate, potassium silicate, sodium metasilicate, potassium metasilicate, sodium phosphate, potassium silicate, ammonia and aminoalcohols (e.g., monoethanolamine, diethanolamine, triethanolamine). An organic solvent is preferably added to an aqueous etching solution. The organic liquid preferably is an alcohol or an ether. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols described above as the alkaline compounds. Examples of the ethers are cellosolves. The solvent may further contain the other additives such as a surface active agent and a defoaming agent. Commercially available developing solutions are also available. Before the removing step, a light-sensitive layer or other hydrophilic layers may be removed by washing the light-sensitive material with water, or peeling the hydrophilic layers.

The removing step can also be conducted by a sheet based on a difference in the adhesion to the sheet between the hardened area and the unhardened area. The hardened area or the unhardened area is selectively attached to the removing sheet. An image can be formed on the area remaining on the light-sensitive material. The removing sheet can be laminated on the light-sensitive material before the exposing step or the developing step.

[Transferring step]

The obtained image can be transferred to an image receiving material based on a difference in the adhesion to the image receiving material between the hardened area and the unhardened area. The image receiving material can be laminated on the light-sensitive material before the exposing step or the developing step.

[Toning step]

A colored substance (toner) can be attached to the hardened area or the unhardened area. The toner can be selectively attached to the unhardened area based on a difference in the adhesion to the toner between the hardened area and the unhardened area. After the hardened area or the unhardened area is removed, the toner can be attached to the remaining area. Further, the toner can be attached to an adhesive layer, after the hardened area or the unhardened area on the adhesive layer is selectively removed. Furthermore, the toner can be attached to an image receiving material, after the hardened area or the unhardened area is selectively transferred to the image receiving material.

[Dyeing step]

The hardened area or the unhardened area can be selectively dyed to form a visible image. The dyeing step can also be conducted to an image receiving material, after the hardened area or the unhardened area is selectively transferred to the image receiving material.

The obtained image is available as a printing plate, a color proof, a hard copy or a relief image.

EXAMPLE 1 & COMPARISON EXAMPLE 1

Preparation of aluminum support

A surface of an aluminum plate (according to JIS-A-1050) having thickness of 0.24 mm was ground using a nylon brush and an aqueous suspension of pumice stone of 400 mesh. The plate was well washed out with water. The aluminum plate was then immersed for etching in 10% aqueous solution of sodium hydroxide at 70° C. for 60 seconds. The plate was washed out with running water, then neutralized with 20% aqueous solution of nitric acid and washed out with water.

The aluminum plate was subjected to an electrolytic surface-roughening treatment in 1% aqueous solution of nitric acid containing 0.5% aluminum nitrate in an anodically electric amount of 160 coulomb/dm² using sine wave alternating-corrugated current under such conditions as an anodic voltage of 12.7 V and a cathodically electric amount ratio to an anodically electric amount of 0.9. The center line average height (Ra) of the aluminum plate was 0.6 μm.

The aluminum plate was immersed in 1% aqueous solution of sodium hydroxide at 40° C. for 30 seconds. The plate was then immersed in 30% aqueous solution of sulfuric acid at 55° C. for 1 minute. Further, the plate was subjected to anodizing treatment in 20% aqueous solution of sulfuric acid at a current density of 2 A/dm² to form an anodic oxide layer having the thickness of 2.5 g/dm².

Thus, an aluminum support (A0) was prepared.

On the aluminum support (A0), the following solution (1) was coated and dried (100° C., 60 seconds) to form an intervening layer. The dry coating amount was 10 mg/m².

Thus, an aluminum support (A1) was prepared.

| Solution (1) | Silver nitrate | 0.05 g |
|---|---|---|
| | Water | 100 g |

Preparation of pigment dispersion

The following composition was dispersed at 45° C. and 3,000 rpm for 1 hour using a Dynomill dispersing device to obtain a pigment dispersion having the average particle size of 0.10 μm.

| Pigment dispersion | |
|---|---|
| Pigment (Chromofutal Red A2B) | 30 g |
| Allyl methacrylate-methacrylic acid copolymer (binder, copolymerization ratio = 83/17) | 12 g |
| Cyclohexanone (solvent) | 30 g |
| Propylene glycol monomethyl ether (solvent) | 40 g |

Formation of polymerizable layer

The following coating solution was coated and dried on the aluminum support (A0) or (A1) to form a polymerizable layer having the dry thickness of 1.3 μm.

| Coating solution of polymerizable layer | |
|---|---|
| Pentaerythritol tetraacrylate | 5.0 g |
| Propylene glycol monomethyl ether solution (20 wt. %) of allyl methacrylate-methacrylic acid copolymer (copolymerization ratio = 80/20) | 37.5 g |
| Pigment dispersion | 13.0 g |
| Methyl ethyl ketone | 74.0 g |

Preparation of silver halide emulsion

Gelatin, potassium bromide and water were placed in a vessel and kept at 55° C. An appropriate amount of ammonium was added to the vessel. Further, an aqueous solution of silver nitrate and an aqueous solution of potassium bromide containing a hexachloroiridate(III) salt (the molar ratio of iridium to silver is $10^{-7}$ mol) were added to the vessel according to a double jet method while keeping the pAg of 7.60 in the reaction vessel to prepare a monodispersed silver bromide emulsion, which has the average grain size of 0.3 μm. The emulsion was desalted, and adjusted to pH 6.2 and pAg 8.7. The emulsion was then subjected to gold and sulfur sensitization using sodium thiosulfate and chloroauric acid. The following sensitizing dye was added to the emulsion. The mixture was kept at 55° C. for 20 minutes. Further, a silver iodide pre-ripening emulsion having the average particle size of 0.08 μm was added to the emulsion. The mixture was stirred for 15 minutes, desalted and cooled. The silver iodide content of the obtained emulsion was 2 mol %. The size of 98% of the grains is present within the range of ±40% of the average grain size. The ratio of (100) plane per (111) planes was about 10. Thus, a silver halide emulsion was prepared.

(Senisitizing dye)

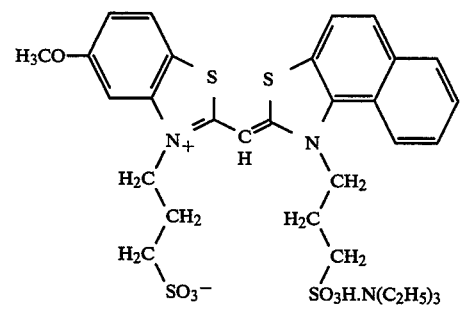

Preparation of reducing agent dispersion

In Dynomill dispersing device, 100 g of powder of the following reducing agent was dispersed in 900 g of 2.2 wt. % aqueous solution of polyvinyl alcohol (PVA-205, Kuraray Co., Ltd.). The particle size of the reducing agent was not more than about 0.8 μm.

(Reducing agent)

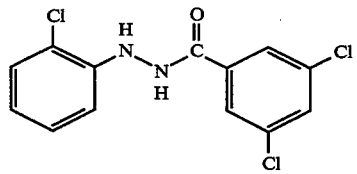

Formation of light-sensitive layer

The following coating solution was coated and dried on the polymerizable layer to form a light-sensitive layer having the dry thickness of about 1.2 μm.

| Coating solution of light-sensitive layer | |
|---|---|
| 10 Wt. % aqueous solution of polyvinyl alcohol (PVA-420, Kuraray Co., Ltd., saponification degree: 79.5%) | 10.5 g |
| 0.11 Wt. % methanol solution of the following additive | 0.83 g |
| Silver halide emulsion | 0.5 g |
| 5 Wt. % aqueous solution of the following surface active agent | 0.4 g |
| Water | 7.8 g |

| Coating solution of light-sensitive layer | |
|---|---|
| Reducing agent dispersion | 1.2 g |

(Additive)

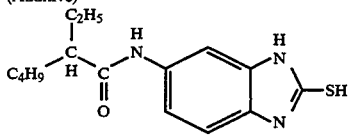

(Surface active agent)

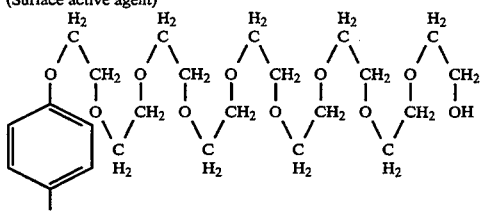

Preparation of base precursor dispersion

In 750 g of 3 wt. % aqueous solution of polyvinyl alcohol (PVA-205, Kuraray Co., Ltd. ) was dispersed 250 g of powder of the following base precursor using Dynomill dispersing device. The particle size of the base precursor was not more than about 0.5 μm.

(Base precursor)

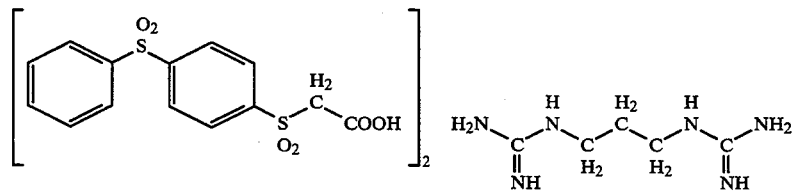

Formation of image formation accelerating layer

The following coating solution was coated and dried on the light-sensitive layer to form an image formation accelerating layer having the dry thickness of about 3.3 μm.

| Coating solution of image formation accelerating layer | |
|---|---|
| 10 Wt. % aqueous solution of polyvinyl alcohol (PVA-205, Kuraray Co., Ltd., saponification degree: 98.5%) | 200.0 g |
| Base precursor dispersion | 1.25 g |
| 5 Wt. % aqueous solution of the surface active agent shown above | 4.0 g |

Preparation of alkaline solvent

The following alkaline solvent (pH: 13.5) was prepared.

| Alkaline solvent | |
|---|---|
| 18 Wt. % aqueous solution of potassium silicate | 125.0 g |
| Potassium hydroxide | 15.0 g |
| Water | 750.0 g |

(Image formation)

The light-sensitive material was exposed to light for 1.5 second by a tungsten lamp of 500 W and through a band pass filter of 500 nm. The aluminum support of the light-sensitive material was placed on a hot plate heated at 140° C. Further, a polyethylene terephthalate (PET) film was placed on the surface of the light-sensitive material. The light-sensitive material was then heated for 50 seconds from the support. Thus silver halide was developed to form a silver image.

The light-sensitive material was washed with the alkaline solvent using a brash in an automatic developing machine. The light-sensitive material was well washed with water to remove the unexposed layer. Thus, a red polymer relief image was obtained within the exposed area. The obtained image has a high contrast.

The maximum and minimum densities were evaluated. Further, the polymer spots within the non-image area were evaluated in such a manner that the spots having a diameter of not less than 10 μm were counted within the non-image area of 1 cm². The numbers were classified into four grades, namely zero (0), 1 to 2 (1–2), 3 to 10 (3–10) and 11 or more ($\geq 11$).

Furthermore, a printed image was formed using the obtained polymer image as a printing plate. The ink stains in the printed image was evaluated in the same manner as in the evaluation of the polymer spots.

The results are set forth in Table 1.

TABLE 1

| Al support | Intervening | SEP* (V) | Maximum density | Minimum density | Polymer spots | Ink stains |
|---|---|---|---|---|---|---|
| A0 | None | — | 1.25 | 0.33 | $\geq 11$ | $\geq 11$ |
| A1 | AgNO₃ | 0.799 | 1.26 | 0.33 | 0 | 0 |

Remark(SEP*): Standard electrode potential

EXAMPLES 2 TO 8

Aluminum supports (A2) to (A9) were prepared in the same manner as in Example 1, except that the following coating solutions (2) to (9) were respectively coated on the aluminum support (A0). Light-sensitive materials were prepared and evaluated in the same manner as in Example 1, except that the aluminum supports (A2) to (A9) were used. The results are set forth in Table 2.

| Solution (2) | Copper(II) nitrate | 0.05 g |
|---|---|---|
| | Water | 100 g |
| Solution (3) | Potassium permanganate | 0.15 g |
| | Water | 100 g |
| Solution (4) | Potassium tetrachloroplatinate(II) | 0.10 g |
| | Water | 100 g |
| Solution (5) | Potassium chloroplatinate(IV) | 0.10 g |
| | Water | 100 g |
| Solution (6) | Palladium acetate | 0.03 g |
| | Acetone | 100 g |
| Solution (7) | Palladium nitrate | 0.10 g |
| | Acetone | 100 g |
| Solution (8) | Chloroauric(III) acid | 0.005 g |
| | Water | 100 g |
| Solution (9) | Silver acetate | 0.10 g |
| | Acetone | 100 g |

COMPARISON EXAMPLES 2 TO 9

Aluminum supports (A10) to (A13) were prepared in the same manner as in Example 1, except that the following coating solutions (10) to (13) were respectively coated on the aluminum support (A0). Light-sensitive materials were prepared and evaluated in the same manner as in Example 1, except that the aluminum supports (A10) to (A13) were used. The results are set forth in Table 2.

| Solution (10) | Sodium nitrate | 0.10 g |
|---|---|---|
|  | Water | 100 g |
| Solution (11) | Manganese sulfate | 0.10 g |
|  | Water | 100 g |
| Solution (12) | Zinc sulfate | 0.10 g |
|  | Water | 100 g |
| Solution (13) | Nickel nitrate | 0.10 g |
|  | Water | 100 g |

TABLE 2

| Al support | Intervening | SEP* (V) | Maximum density | Minimum density | Polymer spots | Ink stains |
|---|---|---|---|---|---|---|
| A2 | $Cu(NO_3)_2$ | 0.337 | 1.25 | 0.33 | 3–10 | 3–10 |
| A3 | $KMnO_4$ | 0.799 | 1.26 | 0.33 | 3–10 | 3–10 |
| A4 | $K_2[PtCl_4]$ | 0.73 | 1.28 | 0.36 | 0 | 1–2 |
| A5 | $K_2[PtCl_6]$ | 0.68 | 1.30 | 0.35 | 0 | 1–2 |
| A6 | $(Ac**)_2Pd$ | 0.987 | 1.29 | 0.36 | 0 | 1–2 |
| A7 | $Pd(NO_3)_2$ | 0.987 | 1.24 | 0.33 | 0 | 1–2 |
| A8 | $HAuCl_4$ | 1.00 | 1.33 | 0.37 | 1–2 | 1–2 |
| A9 | $CH_3COOAg$ | 1.00 | 1.29 | 0.34 | 1–2 | 1–2 |
| A10 | $NaNO_3$ | −2.714 | 1.24 | 0.33 | ≧11 | ≧11 |
| A11 | $MnSO_4$ | −1.18 | 1.23 | 0.37 | ≧11 | ≧11 |
| A12 | $ZnSO_4$ | −0.763 | 1.25 | 0.34 | ≧11 | ≧11 |
| A13 | $Ni(NO_3)_2$ | −0.250 | 1.24 | 0.33 | ≧11 | ≧11 |

Remark(SEP*): Standard electrode potential
(Ac**): $CH_3COO$ (Acetate)

EXAMPLES 10 TO 12

The aluminum support (A0) used in Example 1 was immersed in a 3 wt. % aqueous solution of sodium silicate for a hydrophilic treatment at 70° C. for 20 seconds. The support was washed with water and dried to obtain an aluminum support (B0). On the aluminum support (B0), the solutions (1) to (3) used in Examples 1 to 3 were coated and dried (at 100° C. for 60 seconds) to obtain aluminum supports (B1) to (B3).

Light-sensitive materials were prepared and evaluated in the same manner as in Example 1, except that the aluminum supports (B1) to (B3) were used. The results are set forth in Table 3.

COMPARISON EXAMPLE 6

AN aluminum support (B14) was prepared in the same manner as in Example 10, except that the following coating solution (14) was coated on the aluminum support (B0).

A light-sensitive material was prepared and evaluted in the same manner as in Example 1, except that the aluminum support (B14) was used. The results are set forth in Table 3.

| Solution (14) | Aluminum sulfate | 0.10 g |
|---|---|---|
|  | Water | 100 g |

TABLE 3

| Al support | Intervening | SEP* (V) | Maximum density | Minimum density | Polymer spots | Ink stains |
|---|---|---|---|---|---|---|
| B2 | $AgNO_3$ | 0.799 | 1.28 | 0.32 | 0 | 0 |
| B3 | $Cu(NO_3)_2$ | 0.337 | 1.23 | 0.33 | 1–2 | 0 |
| B4 | $KMnO_4$ | 0.564 | 1.25 | 0.33 | 1–2 | 0 |
| B14 | $Al_2(SO_4)_3$ | −1.66 | 1.24 | 0.34 | ≧11 | ≧11 |

Remark(SEP*): Standard electrode potential

EXAMPLE 13

On the aluminum support (A0) used in Example 1, the following solutions (15) was coated and dried (at 100° C. for 60 seconds) to obtain an aluminum support (A15).

A light-sensitive material was prepared and evaluated in the same manner as in Example 1, except that the aluminum support (A15) was used. The results are set forth in Table 4.

| Solution (15) | Silver nitrate | 0.02 g |
|---|---|---|
|  | Polyvinyl alcohol | 5.0 g |
|  | (PVA-205, Kuraray Co., Ltd.) |  |
|  | Water | 100 g |

TABLE 4

| Al support | Intervening | SEP* (V) | Maximum density | Minimum density | Polymer spots | Ink stains |
|---|---|---|---|---|---|---|
| A15 | $AgNO_3$ | 0.799 | 1.26 | 0.35 | 0 | 1–3 |

Remark(SEP*): Standard electrode potential

As is shown in the results of Tables 1 to 4, the light-sensitive materials of the present invention form a clear image in which the polymer spots are reduced. Further, the discrimination of the obtained image is also improved. Furthermore, the light-sensitive materials form a clear printed image in which the spots and the ink stains are reduced.

I claim:

1. A silver halide light-sensitive material which comprises an aluminum support, an anodic oxide layer and a light-sensitive polymerizable layer in that order, said light-sensitive polymerizable layer containing silver halide, a reducing agent and an ethylenically unsaturated polymerizable compound or a cross-linkable polymer, wherein an intervening layer is further provided between the anodic oxide layer and the light-sensitive polymerizable layer, said intervening layer containing a compound having a metal cation or a metal oxide anion, and said metal cation or said metal oxide anion having a standard electrode potential of 0 V or more.

2. The silver halide light-sensitive material as claimed in claim 1, wherein the aluminum support is made of an aluminum plate having a metal purity of not less than 90 wt. %.

3. The silver halide light-sensitive material as claimed in claim 1, wherein the aluminum support has a thickness in the range of 0.1 to 0.5 mm.

4. The silver halide light-sensitive material as claimed in claim 1, wherein the aluminum support has a rough surface, on which the anodic oxide layer is provided.

5. The silver halide light-sensitive material as claimed in claim 1, wherein the anodic oxide layer is provided in an amount of not less than 1.0 g/m².

6. The silver halide light-sensitive material as claimed in claim 1, wherein the metal cation or the metal oxide anion is $Cu^{2+}$, $Cu^+$, $Pd^{2+}$, $Ag^+$, $Pt^{2+}$, $Pt^{4+}$, $Au^{3+}$, $Hg^+$, $Hg^{2+}$, $MnO_4^-$, $Cr_2O_7^{2-}$, $Co^{3+}$, $Rh^{3+}$, $FeO_4^{2-}$ or $ReO_4^-$.

7. The silver halide light-sensitive material as claimed in claim 1, wherein the compound having the metal cation or the metal oxide anion is copper(II) nitrate, palladium(II) nitrate, silver nitrate, mercury(II) nitrate, copper(II) sulfate, palladium(II) sulfate, silver sulfate, mercury(I) sulfate, mercury(II) sulfate, copper(I) chloride, copper(II) chloride, palladium(II) chloride, silver chloride, silver bromide, silver iodide, potassium tetrachloroplatinate(II), potassium chloroplatinate(IV), chloroplatinic(IV) acid, chloroauric(III) acid, sodium chloroaurate(III), potassium cyanoaurate(III), silver nitrate, palladium acetate, silver carbonate, silver chlorate, silver chromate, silver 4-cyclohexylbutyric acid, silver 2,3-dibromopropionate, silver iodate, silver lactate, silver nitrite, silver perchlorate, silver tetrafluoroborate, silver thiocyanate, silver p-toluenesulfonate, silver vanadate, iron(VI) oxide hydrate, perrhenic acid, rhodium(III) chloride or cobalt(III) hydroxide.

8. The silver halide light-sensitive material as claimed in claim 1, wherein the metal cation or the metal oxide anion has a standard electrode potential in the range of 0.3 to 1.0 V.

9. The silver halide light-sensitive material as claimed in claim 1, wherein the intervening layer contains the compound having the metal cation or the metal oxide anion in an amount of 0.0001 to 20 wt. % based on an amount of a coating solution of the intervening layer.

10. The silver halide light-sensitive material as claimed in claim 1, wherein the intervening layer further contains a hydrophilic polymer as a binder.

11. The silver halide light-sensitive material as claimed in claim 1, wherein the intervening layer further contains a binder in an amount of 0.1 to 30 wt. % based on an amount of a coating solution of the intervening layer.

12. The silver halide light-sensitive material as claimed in claim 1, wherein the intervening layer has a dry coating amount in the range of 0.1 to 100 mg/m$^2$.

13. The silver halide light-sensitive material as claimed in claim 1, wherein the light-sensitive polymerizable layer comprises a light-sensitive layer containing silver halide and a polymerizable layer containing the ethylenically unsaturated polymerizable compound or the cross-linkable polymer.

14. The silver halide light-sensitive material as claimed in claim 1, wherein the light-sensitive material further comprises an image formation accelerating layer containing a base precursor.

* * * * *